United States Patent
Huh et al.

(10) Patent No.: US 9,362,025 B1
(45) Date of Patent: Jun. 7, 2016

(54) COATED CONDUCTOR HIGH TEMPERATURE SUPERCONDUCTOR CARRYING HIGH CRITICAL CURRENT UNDER MAGNETIC FIELD BY INTRINSIC PINNING CENTERS, AND METHODS OF MANUFACTURE OF SAME

(75) Inventors: Jeong-Uk Huh, Austin, TX (US); Patrick Turner, Santa Barbara, CA (US); Christopher Yung, Santa Barbara, CA (US); Brian Moeckly, Santa Barbara, CA (US); Viktor Gliantsev, San Jose, CA (US)

(73) Assignee: SUPERCONDUCTOR TECHNOLOGIES, INC., Santa Barbara, CA (US)

( * ) Notice: Subject to any disclaimer, the term of this patent is extended or adjusted under 35 U.S.C. 154(b) by 906 days.

(21) Appl. No.: 13/369,186

(22) Filed: Feb. 8, 2012

(51) Int. Cl.
*H01B 12/06* (2006.01)
(52) U.S. Cl.
CPC .................................. *H01B 12/06* (2013.01)
(58) Field of Classification Search
CPC . H01L 39/126; H01L 39/143; H01L 39/2419;
H01L 39/2425; H01L 39/2432; H01L 39/2435; H01L 39/2438; H01L 39/2448; H01L 39/2454; H01L 39/2461; H01L 39/248; H01L 39/2483; H01B 12/02; H01B 12/06; H01F 6/06; C04B 35/45; C04B 35/4504; C04B 35/4508; C30B 29/22; C30B 29/225; C30B 29/32; C23C 14/00212; C23C 14/0036; C23C 14/081; C23C 14/083; C23C 14/087; C23C 14/221; C23C 14/34
USPC ......... 505/150, 230, 236, 237, 238, 239, 434; 505/470, 473, 704; 428/469, 472, 701, 702; 174/125.1; 29/599; 427/62
See application file for complete search history.

(56) References Cited

U.S. PATENT DOCUMENTS 5,047,385 A    9/1991    Beasley et al.
5,929,000 A    7/1999    Hahakura et al.
(Continued)

FOREIGN PATENT DOCUMENTS

WO    WO 2007/117305 A2    10/2007
WO    WO 2007/117305 A3    10/2007

OTHER PUBLICATIONS

Oh et al, "Development of long-length SmBCO coated conductors using a batch-type reactive co-evaporation method," Supercond. Sci. Technol. 21 (2008) 034003 (6pp).*

(Continued)

*Primary Examiner* — Colleen Dunn
(74) *Attorney, Agent, or Firm* — David B. Murphy; O'Melveny & Myers

(57) ABSTRACT

This invention enables high temperature superconducting (HTS) metal oxide materials $ReBa_2Cu_3O_x$ ((RE)BCO) to carry high superconducting currents at high current densities under high magnetic field (≥3 Tesla), in all orientations of the field, and at high temperatures (65 Kelvin). The superconductor is adapted to carry current in a superconducting state, with the superconductor having a current (I) carrying capacity of at least 250 A/cm width, in a field of 3 Tesla (T), at 65 Kelvin (K), at all angles relative to the coated conductor. More preferably, the current carrying capacity extends through the range of substantially 250 A/cm to 500 A/cm. Excellent performance is achieved by use of intrinsic pinning centers in the HTS compound. The invention preferably does not require the addition of extra elements or compounds or particles to the superconducting compound during synthesis, nor does it require extra process steps.

35 Claims, 12 Drawing Sheets

(56) References Cited

U.S. PATENT DOCUMENTS

| | | | |
|---|---|---|---|
| 5,932,523 | A | 8/1999 | Fujikami et al. |
| 6,147,033 | A | 11/2000 | Youm et al. |
| 6,190,752 | B1* | 2/2001 | Do et al. ............... 428/141 |
| 6,271,474 | B1 | 8/2001 | Fujikami et al. |
| 6,294,025 | B1 | 9/2001 | Kinder et al. |
| 6,309,767 | B1 | 10/2001 | Nies |
| 6,383,989 | B2 | 5/2002 | Jia et al. |
| 6,428,635 | B1 | 8/2002 | Fritzemeier et al. |
| 6,541,136 | B1 | 4/2003 | Kwon et al. |
| 6,569,812 | B2 | 5/2003 | Watanabe et al. |
| 6,600,939 | B1 | 7/2003 | Zhao |
| 6,602,588 | B1 | 8/2003 | Kwon et al. |
| 6,624,122 | B1 | 9/2003 | Holesinger et al. |
| 6,730,410 | B1 | 5/2004 | Fritzemeier et al. |
| 6,756,139 | B2 | 6/2004 | Jia et al. |
| 6,765,151 | B2 | 7/2004 | Fritzemeier et al. |
| 6,800,591 | B2 | 10/2004 | Jia et al. |
| 6,849,580 | B2 | 2/2005 | Norton et al. |
| 7,109,151 | B2 | 9/2006 | Lee et al. |
| 7,129,196 | B2 | 10/2006 | Foltyn et al. |
| 7,286,032 | B2 | 10/2007 | Lee et al. |
| 7,737,085 | B2* | 6/2010 | Arendt et al. ............... 505/237 |
| 7,737,087 | B2 | 6/2010 | Driscoll et al. |
| 7,838,061 | B2 | 11/2010 | Oh et al. |
| 8,326,387 | B2 | 12/2012 | Miura et al. |
| 2005/0173679 | A1 | 8/2005 | Mannhart et al. |
| 2007/0125303 | A1 | 6/2007 | Ruby et al. |
| 2008/0176749 | A1* | 7/2008 | Goyal ............... 505/125 |
| 2010/0107979 | A1 | 5/2010 | Youm et al. |
| 2010/0179063 | A1 | 7/2010 | Martchevskii |
| 2011/0028328 | A1 | 2/2011 | Selvamanickam et al. |
| 2011/0034338 | A1 | 2/2011 | Goyal et al. |
| 2011/0303153 | A1 | 12/2011 | Moeckly et al. |
| 2013/0196856 | A1 | 8/2013 | Li et al. |

OTHER PUBLICATIONS

Arendt, et al., "Development of Coated Conductors Using Ion-Beam Assisted Deposition", Superconductivity for Electric Systems Annual Peer Review, Jul. 23-25, 2003, Washington, D.C., 78 pages.
Arendt, et al., "Development of Coated Conductors Based on IBAD MgO", Superconductivity for Electric Systems Annual Peer Review, Jul. 27-29, 2004, Washington D.C., 19 pages.
Ashworth, "AC Losses in Coated Conductors", Superconductivity for Electric Systems Annual Peer Review, Jul. 27-29, 2004, Washington, D.C., 31 pages.
Aytug, et al., "RABiTS-Based Strategic Research", Oak Ridge National Laboratory, 2004, 77 pages.
Aytug, et al., "Enhanced Flux Pinning in MOCVD-YBCO Films Through Zr Additions: Systematic Feasibility Studies", Supercond. Sci. Technol., vol. 23, 2010, 1-7.
Aytug, et al., "ORNL-SuperPower CRADA: Development of MOCVD-Based, IBAD-2G Wires", Oak Ridge National Laboratory, 2010, pp. 1-43.
Cantoni, et al., "Conductive Buffer Layers and Overlayers for the Thermal Stability of Coated Conductors", IEEE Transactions on Applied Superconductivity, vol. 11, No. 1, Mar. 2001, pp. 3309-3312.
Cantoni, et al., "Strategic Substrate Development for Coated Conductors", Oak Ridge National Laboratory, 2010, pp. 1-28.
Civale, et al. "Angular Dependent Vortex Dynamics in Superconductors With Columnar Defects", arXiv:cond-mat/0308505v1[cond-mat.supr-con], Aug. 25, 2003, pp. 1-48.
Civale, et al., "Understanding High Critical Currents in YBaCu$_3$O$_7$ Thin Films and Coated Conductors", Journal of Low Temperature Physics, vol. 135, Nos. 1/2 , Apr. 2004, pp. 87-98.
Civale, et al., "LANL-SuperPower CRADA: Development and Multi-Scale Characterization of IBAD MgO/MOCVD YBCO Coated Conductors", Advanced Cables and Conductors Annual Peer Review, Jun. 29-Jul. 1, 2010, Alexandria, VA., 39 pages.
Feenstra, et al., "Development of High I$_c$ Ex Situ Processed YBCO Coated Conductors", Superconductivity for Electric Systems Annual Peer Review, Jul. 27-29, 2004 , Washington, D.C., pp. 1-71.

Flükiger, "Overview of HTS Conductors and MgB2 Wires", HTS4 Fusion Conductor Workshop, May 26-27, 2011, Karlsruhe, pp. 1-52.
Foltyn, et al. "Strongly Coupled Critical Current Density Values Achieved in Y$_1$Ba$_2$Cu$_3$O$_7$ -δ Coated Conductors with Near-Single-Crystal Texture", Applied Physics Letters, vol. 82, No. 25, Jun. 23, 2003, pp. 4519-4521.
Foltyn, et al. "High Current Coated Conductors Based on IBAD MgO and PLD YBCO", Superconductivity for Electric Systems Annual Peer Review, Jul. 27-29, 2004, 35 pages.
Foltyn, et al., "Materials Science Challenges for High-Temperature Superconducting Wire", Nature Materials, vol. 6, Sep. 2007, pp. 631-642.
Fu, et al., "Copper Stabilization of YBCO Coated Conductor for Quench Protection", IEEE Transactions on Applied Superconductivity, vol. 13, No. 2, Jun. 2003, pp. 1780-1783.
Gouge, et al., "Superconducting Partnership with Industry: Readiness Review Update", DOE 2004 Superconductivity Peer Review, Jul. 27-29, 2004, pp. 1-34.
Goyal, et al., "The RABiTS Approach: Using Rolling-Assisted Biaxially Textured Substrates for High-Performance YBCO Superconductors", MRS Bulletin, Aug. 2004, pp. 552-561.
Goyal, et al., "Engineered Defects for Coated Conductors", Oak Ridge National Laboratory, 2010, 32 pages.
Groves, et al., "Investigation of Early Nucleation Events in Magnesium Oxide During Ion Beam Assisted Deposition", http://www.stanford.edu/group/clemonsgroup/MRS08.paper.pdf, 2008, 11 pages.
Hawsey, et al., "ORNL Superconducting Technology Program for Electric Power Systems Annual Report for FY 1999", ORNL/HTS;C-11, Apr. 2000, cover page and pp. i-4-8.
Hawsey, et al., "ORNL Superconducting Technology Program for Electric Power Systems Annual Report for FY 2000", ORNL/HTSPC-12, Apr. 2001, cover page and pp. i-5.5.
Hawsey, et al., "ORNL Superconducting Technology Program for Electric Power Systems Annual Report for FY 2001", ORNL/HTSPC-13, Feb. 2002, cover page and pp. i-5.7.
Hawsey, et al., "ORNL Superconducting Technology Program for Electric Power Systems Annual Report for FY 2002", ORNL/HTSPC-14, May 2003, cover page and pp. i-5.9.
Hawsey, et al., "ORNL Superconducting Technology Program for Electric Power Systems Annual Report for FY 2003", ORNL/HTSPC-15, Jun. 2004, cover page and pp. i-5.11.
Hawsey, et al., "ORNL Superconducting Technology Program for Electric Power Systems Annual Report for FY 2004", ORNL/HTSPC-16, Jul. 2005, cover page and pp. i-5.7.
Hawsey, et al., "ORNL Superconducting Technology Program for Electric Power Systems Annual Report for FY 2005", ORNL/HTSPC-17, May 2006, cover page and pp. 1-5.7.
Huh, et al., "Fabrication and In-field Measurement of HTS Films on Simplified Templates for Low-cost Coated Conductors", Materials Research Society Spring Meeting, Apr. 26, 2011, pp. 1-16.
Huh et al, "Fabrication and Performance of HTS films on Simplified Templates for Low-Cost Coated Conductors", EUCAS-ISEC-ICMC, Sep. 20, 2011, pp. 1-17.
Iiijima et al., "Research and Development of Biaxially Textured IBAD-GZO Templates for Coated Superconductors", MRS Bulletin, Aug. 2004, pp. 564-571.
Inoue, et al., "In-Field Current Transport Properties of 600 A-Class GdBa$_2$Cu$_3$O$_7$-δ Coated Conductor Utilizing IBAD Template", IEEE Transactions on Applied Superconductivity, vol. 21, No. 3, Jun. 2011, pp. 3206-3209.
Kinder, et al., "YBCO Film Deposition on Very Large Areas up to 20×20cm$^2$," Physica C 282-287, 1997, pp. 107-110.
Kurchatov Institute, "Status of Work on High-Tc Superconductors of the 2$^{nd}$ Generation in the World in Feb. 2007", Tom 4, Issue 2, 2007, 3 pages.
Larbalestier, et al., "High T$_c$ Superconducting Materials for Electric Power Applications", Nature, vol. 414, Nov. 15, 2001, pp. 368-377.
Lee et al., "ORNL Superconducting Technology Program for Electric Power Systems Annual Report for FY 2006", ORNL/HTSPC-18, Sep. 2007, cover page and pp. i-5.8.

(56) References Cited

OTHER PUBLICATIONS

Lee et al., "ORNL Superconducting Technology Program for Electric Power Systems Annual Report for FY 2007", ORNL/HTSPC-20, Jan. 24, 2008, cover page and pp. i-A-2.
Lee, "HTS Image Gallery", Applied Superconductivity Center, Florida State University, 2008, 2 pages.
Li, et al., "AMSC-LANL CRADA, Structure-Property Characterizations of MOD-YBCO / RABiTS Coated Conductors", 2010 Advanced Cables and Conductors Peer Review, Jun. 29-Jul. 1, 2010, Alexandria, VA, pp. 1-55.
Lindsay, et al., "High Temperature Superconducting Cable", 2003 Annual Peer Review, Jul. 23-25, 2003, Washington, D.C., pp. 1-47.
Llordés, et al., "Nanoscale Strain-Induced Pair Suppression as a Vortex-Pinning Mechanism in High-Temperature Superconductors", Nature Materials, vol. 11, Apr. 2012, pp. 329-335.
Macmanus-Driscoll, et al., "Understanding and Improving Pinning in Coated Conductors Part II: Improving Pinning", Superconductivity for Electric Systems Annual Peer Review, Jul. 27-29, 2004, Washington, D.C., 30 pages.
Macmanus-Driscoll, et al., "Systematic Enhancement of in-field Critical Current Density with Rare-Earth Ion Size Variance in Superconducting Rare-Earth Barium Cuprate Films", Applied Physics Letters, vol. 84, No. 26, Jun. 28, 2004, pp. 5329-5331.
Maiorov, et al., "Improving Flux Pinning in $YBA_2Cu_3O_7$ Coated Conductors by Changing the Buffer Layer Deposition Conditions", High-Temperature Superconductor Materials, Devices, and Applications, Ceramic Transactions, vol. 160, Proceedings of the 106$^{th}$ Annual Meeting of the American Ceramic Society, Indianapolis, Indiana, USA, 2004, pp. 3-13.
Maiorov, et al., "Understanding and Improving in-field $J_c$ in YBCO Thin Films", DOE Wire Workshop, Jan. 19-20, 2005, St. Petersburg, FL., 27 pages.
Maiorov, et al., "Synergetic Combination of Different Types of Defect to Optimize Pinning Landscape Using $BaZrO_3$-doped $YBA_2Cu_3O_7$", Nature Materials, vol. 8, May 2009, pp. 398-404.
Malozemoff, et al., "Wire Development Group (WDG) Research Towards Advanced HTS Wire Technologies 2004 DOE Annual Peer Review", Jul. 27-29, 2004, Washington, D.C., 74 pages.
Matias, et al, "LANL/STI CRADA: Progress in Reactive Co-Evaporation on IBAD", HTS Program Peer Review, Aug. 5, 2009, Alexandria, VA., 31 pages.
Matias, et al., "Progress in Reactive Co-Evaporation on IBAD", Advanced Cables and Conductors Program Peer Review, Jun. 30, 2010, Alexandria, VA, pp. 1-22.
Moeckly, et al., "HTS Films Grown by Reactive Coevaporation on Simplified Coated Conductor IBAD-MgO Templates for Low-cost Manufacturing", International Workshop on Coated Conductors for Applications, Nov. 23, 2009, Barcelona, Spain,. 16 pages.
Moeckly, "Development of 2G HTS Coated Conductors at STI", Tenth EPRI Superconductivity Conference, Wednesday, Oct. 12, 2011, 25 pages.
Navigant Consulting, Inc., "High Temperature Superconductivity Market Readiness Review", HTS Peer Review, Jul. 25, 2006, cover page and pp. 1-25.
Navigant Consulting, Inc., "HTS Value Propositions for Utility Applications", HTS Peer ReView, Jul. 29, 2008, cover page and pp. 1-21.
Navigant Consulting, Inc., "Framework for Evaluating High Value Utility Applications of HTS", HTS Peer Review, Aug. 4, 2009, cover page and pp. 1-26.
Paranthaman, et al., "Alternative Buffer Layer Architectures for YBCO Coated Conductors", Oak Ridge National Library, 2003, 57 pages.
Peterson, et al., "High-Temperature Superconducting Conductors and Cables", LA-UR-96-2832, Sep. 9, 1996, cover page and pp. 1-15.
Peterson, et al, "Superconductivity Program for Electric Systems/ Superconductivity Technology Center/LANL-Annual Progress Report for Fiscal Year 1997", LA-UR 99-424, pp. 1-80.
Peterson, et al., Superconductivity Program for Electric Systems Annual Progress Report for Fiscal Year 1998, LA-UR-996775, cover page and pp. 1-95.
Peterson, et al., "Superconductivity Program for Electric Systems Annual Progress Report for Fiscal Year 1999", LA-UR-003732, cover page and pp. 1-89.
Peterson, et al., "Superconductivity Program for Electric Systems Annual Progress Report for Fiscal Year 2000", LA-UR-01-6483, cover pages and pp. 1-104.
Peterson, et al., "Superconductivity Program for Electric Systems Annual Progress Report for Fiscal Year 2001", LA-UR-032735, cover pages and pp. 1-97.
Peterson, et al., "Superconductivity Program for Electric Systems Annual Progress Report for Fiscal Year 2002", LA-UR-037017, cover page and pp. 1-88.
Peterson, et al., "Superconductivity Program for Electric Systems Annual Progress Report for Fiscal Year 2003", LA-UR-050145, cover pages and pp. 1-111.
Peterson, et al., "Superconductivity Program for Electric Systems Annual Progress Report for Fiscal Year 2004", LA-UR-065412, cover pages and pp. 1-115.
Peterson, et al., "Superconductivity Program for Electric Systems Annual Progress Report for Fiscal Year 2005", LA-UR-070128, cover page and pp. 1-99.
Selvamanickam, et al., "Scale Up of Coated Conductor Technology at SuperPower", Superconductivity for Electrics Systems 2004 Annual Peer Review, Jul. 27-29, 2004, pp. 1-67.
Schoop, et al., "ORNL-AMSC Strategic Research", Superconductivity for Electric Systems Annual Peer Review, Jul. 27-29, 2004, Washington, D.C., 63 pages.
Schwenterly, et al., "HTS Power Transformers", Presented to the 2003 DOE Peer Review Committee for the WES/SP/RG&E/ORNL Team, Jul. 24, 2003, Washington, D.C., pp. 1-44.
STI, Press Release, "Superconductor Technologies Announces 2G high Temperature Superconductor Wire Critical Current Performance Achievement", Feb. 9, 2011, 3 pp.
Thieme, et al., "ORNL-AMSC CRADA Development of RABiTS-Based 2G Wire", 2010 Advanced Cables and Conductors Peer Review, Jun. 29-Jul. 1, 2010, Arlington, VA, pp. 1-31.
University of Houston Center for Advanced Materials (CAM), High Temperature Superconducting Wire (2$^{nd}$ Generation HTS Wire), 2008, 4 pages.
Wang, et al. "Deposition of in-plane Textured MgO on Amorphous $Si_3N_4$ Substrates by ion-beam-assisted Deposition and Comparisons with ion-beam-assisted Deposited yttria-stabilized-zirconia", Appl. Phys. Lett., vol. 71, No. 20, Nov. 17, 1997, pp. 2955-2957.
Wee, et al., "Enhanced Flux Pinning and Critical Current Density via Incorporation of Self-Assembled Rare-Earth Barium Tantalate Nanocolumns Within $YBa_2Cu_3O_7$ δ Films", Physical Review B, vol. 81, 2010, pp. 140503-1-14053-4.
Wee, et al., "Growth of Thick $BaZrO_3$-Doped YBaCu3O7 Films With High Critical Currents in High Applied Magnetic Films", IEEE Transactions on Applied Superconductivity, vol. 19, No. 3, Jun. 2009, pp. 3266-3269.
Zhai et al., "Stanford in situ High Rate YBCO Process Transfer to Metal Tapes and Process Scale up", 2004 DOE Peer Review , 28 pages.
Zhou, et al., "Thickness Dependence of Critical Current Density in $YBa_2Cu_3O_7$ δ-Films with $BaZrO_3$ and $Y_2O_3$ Addition", Supercond. Sci. Technol., vol. 22, 2009, pp. 1-6.
Matias, et al., YBCO films grown by reactive co-evaporation on simplified IBAD-MgO coated conductor templates, Supercond. Sci. Technol. 23, 2010, pp. 1-2.
PCT International Search Report, PCT/US2014/059279, dated Jan. 2, 2015.

* cited by examiner

COATED CONDUCTOR HIGH TEMPERATURE SUPERCONDUCTOR CARRYING HIGH CRITICAL CURRENT UNDER MAGNETIC FIELD BY INTRINSIC PINNING CENTERS, AND METHODS OF MANUFACTURE OF SAME

FIELD OF THE INVENTION

The present invention relates to coated conductor high temperature superconductor (HTS) conductors having high in-field current and current carrying capacity. More particularly, the coated conductors are formed as wires.

RELATED CASE INFORMATION

While no claims of priority are being made, the following cases include relevant subject matter: Ruby, et al., "High-Throughput Deposition System for Oxide Thin Film Growth By Reactive Coevaporation", now published as US Published Application 2007/0125303 and Moeckly et al., "RF-Properties Optimized Compositions of (RE)Ba$_2$Cu$_3$O$_{7-\delta}$, Thin Film Superconductors", now issued as U.S. Pat. No. 7,867,950. Each of these is incorporated herein by reference as if fully set forth herein in their entirety.

BACKGROUND OF THE INVENTION

The last 25 years have shown significant advancements in the performance properties of high temperature superconductors. With those improving performance properties has come the desire to utilize HTS for the practical application of loss-free electrical power transmission and other energy saving applications in the development of the smart grid and other energy

RELATED APPLICATIONS

Early efforts, sometimes termed the first generation (1G) HTS, to form wires did not yield technically or commercially acceptable solutions. The superconductors typically used wire drawing technology, often using variations on Bi$_2$Si$_2$Ca$_2$O$_7$. Unfortunately, the HTS was too brittle and costly due to high silver content for the intended applications.

Efforts in the so-called second generation (2G) HTS have focused on using a thin layer of high quality HTS usually (RE)BaCuO (also known as (RE)BCO, and where (RE) is a rare earth such as yttrium, samarium, gadolinium, neodymium, dysprosium, etc.) usually on a flexible metal substrate. Such 2G HTS is capable of maintaining a dissipation free state while still carrying large electrical currents even in the presence of a large magnetic field such as is found in motor and generator applications. Most proposed solutions adopt the addition of materials beyond the basic components of the HTS in order to provide extrinsic pinning centers. For example, prior art focuses on adding extra pinning centers by incorporating extra elements during film growth, e.g. Zr, Ta, Nb, Sn. Adding these extrinsic elements to (RE)BCO makes the process more complicated and also raises cost. Despite these clear drawbacks, the field relatively uniformly follows this approach. See, e.g., Foltyn et al., "Materials Science Challenges for High-Temperature Superconducting Wire", Nature Materials, Vol. 6, September 2007, pp. 631-641, Maiorov, et al., "Synergetic Combination of Different Types of Defect to Optimize Pinning Landscape Using BaZrO$_3$-doped YBa$_2$Cu$_3$O$_{7-}$, Nature Materials, Vol. 8, May 2009, pp. 398-404, Zhou, et al., "Thickness Dependence of Critical Current Density in YBa$_2$Cu$_3$O$_7$-$\delta$ Films with BaZrO$_3$ and Y$_2$O$_3$ Addition, "Supercond. Sci. Technol. 22 (2009), pp. 1-5, Sung Hun Wee, Amit Goyal, and Yuri L. Zuev, "Growth of thick BaZrO$_3$-doped YBa$_2$Cu$_3$O$_{7-\delta}$ films with high critical currents in high applied magnetic fields", IEEE Transactions on Applied Superconductivity, Volume 19, Number 3, June 2009, pp. 3266-3269, Amit Goyal, M. Parans Paranthaman, and U. Schoop, "The RABiTS Approach: Using Rolling-Assisted Biaxially Textured Substrates for high-performance YBCO superconductors", MRS Bulletin, August 2004, pp. 552-561, T Aytug, M Paranthaman, E D Specht, Y Zhang, K Kim, Y L Zuev, C Cantoni, A Goyal, D K Christen, V A Maroni, Y Chen, and V Selvamanickam, "Enhanced flux pinning in MOCVD-YBCO films through Zr additions: systematic feasibility studies", Superconductor Science and Technology Volume 23 (2010), Sung Hun Wee, Amit Goyal, Eliot D. Specht, Claudia Cantoni, Yuri L. Zuev, V. Selvamanickam, and Sy Cook, "Enhanced flux pinning and critical current density via incorporation of self-assembled rare-earth barium tantalate nanocolumns within YBa$_2$Cu$_3$O$_{7-\delta}$ films", Rapid Communications, Physical Review B Volume 81 (2010), Amit Goyal, Claudia Cantoni, Eliot Specht, Sung-Hun Wee, "Critical current density enhancement via incorporation of nanoscale Ba$_2$(Y,Re)TaO$_6$ in REBCO films", US Patent Application publication US2011/0034338A1, Feb. 10, 2011.

Another approach which has proved less promising to date is introducing microstructural defects into the HTS. See, for example, Selvamanickam published US Application 2011/0028328 which suggests use of a complex surface treatment including the formation of nanorods grown on an array of nanodots, Foltyn et al, where multiple interlayers of CeO2 are grown within the (RE)BCO film to introduce structural defects, and H. Wang et al. U.S. Pat. No. 7,642,222, issued Jan. 5, 2010, where SrTiO$_3$ layers with varied microstructure are used as the seed layer for growth of the (RE)BCO film.

Other investigators have reported on process dependent limitations, such as critical current saturation as a function of film thickness, for coated conductors formed via pulsed laser deposition. See, e.g., Inoue, "In-Field Current Transport Properties of 600 A-Class GdBa$_2$Cu$_3$O$_{7-\delta}$ Coated Conductor Utilizing IBAD Template", IEEE Transactions on Applied Superconductivity, Vol. 21, No. 3, June 2011. A 2.5 µm thick GdBCO film was made by pulsed laser deposition on a Hastelloy substrate, with a 1.1 µm thick GdZrO$_7$ layer made by ion-beam assisted deposition (IBAD), and a 0.5 µm thick CeO$_2$ layer formed by pulsed laser deposition. A silver protection layer was provided. The measured sample was formed from a 1 cm long piece, formed into a microbriadge 70 µm width by 500 µm length. Critical current at 77K and self-field were 600 A/cm-w, and critical temperature was 93 K.

Despite the clear desirability of a coated conductor achieving these objects, the need remains for a comprehensive and effective solution having high yield and low cost in commercially useable lengths.

SUMMARY OF THE INVENTION

A 2$^{nd}$ generation HTS coated conductor is provided having a substrate and a (RE)BCO superconductor supported by the substrate. The superconductor is adapted to carry current in a superconducting state, with the superconductor having a current (I) carrying capacity of at least 250 A/cm width, in a field of 3 Tesla (T), at 65 Kelvin (K), at all angles relative to the coated conductor. More preferably, the current carrying capacity extends through the range of substantially 250 A/cm to 500 A/cm. Preferably, the coated conductor has a critical current ($I_c$) carrying capacity of at least 250 A/cm width, in a field of 3 T, at 65 K, at all angles relative to the coated conductor. Preferably, the coated conductor has a critical current density ($J_c$) carrying capacity of at least 0.5, and more preferably, at least 0.55, MA/cm$^2$, in a field of 3 T, at 65 K, at all angles relative to the coated conductor.

In yet another aspect of the invention, a multilayer structure is provided, having at least a substrate and (RE)BCO superconductor having the properties stated, above. The substrate may be non-flexible, such as a crystal substrate, preferably an MgO crystal substrate. Alternately, the substrate may be flexible, such as a flexible metal tape, preferably made of non-magnetic alloy, such as Hastelloy or stainless steel. Optionally, the substrate is subject to a planarization process, preferably a solution deposition planarization process. Preferably, the planarization process provides a $Y_2O_3$ or other metal oxide solution deposition planarization layer. An optional intermediate layer may be formed between the substrate, or planarization layer if present, and the superconductor layer. Preferably, the intermediate layer is formed by ion beam assisted deposition (IBAD) to form a highly oriented crystalline layer, more preferably an MgO IBAD crystalline layer, followed by an epitaxial MgO layer, more preferably formed by evaporation or sputtering. The (RE)BCO layer is preferably formed via a reactive co-evaporation—cyclic deposition and reaction (RCE-CDR) process. Optional buffer layers and capping layers may be provided.

In yet another aspect, a multi-layer coated conductor is formed having a substrate and a (RE)BCO superconductor supported by the substrate, the superconductor adapted to carry current in a superconducting state, where that structure is formed by the process and method steps of, first, providing a first substrate having a first face, second, planarizing at least the first face of the substrate to form a planarized surface, third, forming an ion beam assisted deposition epitaxial layer on the planarized surface, and lastly forming the (RE)BCO superconductor in a layer supported by the epitaxial layer. Additional optional layers may be formed between or on those layers mentioned. Preferably, the planarizing is performed via solution deposition planarization. Also preferably, the ion beam assisted deposition epitaxial layer is an MgO layer.

In yet another aspect of the invention, a multi-layer coated conductor has a substrate having a first face, the substrate having a length dimension of at least one meter, an epitaxial layer supported by the substrate, and a (RE)BCO superconductor layer supported by the epitaxial layer, the layer having a thickness of at least 2 microns and a length of at least one meter, the superconductor adapted to carry current in a superconducting state, having an critical current ($I_c$) of at least 100 A/cm width at a temperature of 65 K in a field of 3 Tesla at all angles. More preferably, the conductor has a critical current of at least 200 A/cm width at a temperature of 65 K in a field of 3 Tesla at all angles. Most preferably, the conductor has a critical current of at least 200 A/cm width at a temperature of 65 K in a field of 3 Tesla at all angles.

In yet another aspect of these inventions, a multi-layer coated conductor has a substrate having a first face, a planarization layer disposed adjacent the first face of the substrate, a ion beam assisted deposition epitaxial layer supported by the planarization layer, and a (RE)BCO superconductor supported by the epitaxial layer, the superconductor adapted to carry current in a superconducting state, having an critical current ($I_c$) of at least 50 A/cm, more preferably 100 A/cm, and most preferably 200 A/cm, at a temperature of 77 K and no external magnetic field (self field).

One object of this invention is to produce HTS material with intrinsic pinning centers on an industrial scale and at a low cost. This invention preferably avoids additional elements in order to maintain high critical current density under high DC magnetic field. This invention utilizes intrinsic pinning centers that maintain high critical current in high fields at high temperatures. The key steps in the processes are all inherently scalable to large area, long length and high throughput, making them ideal for industrial applications. Also this approach makes it possible to reduce the number of process steps, therefore, lowering the overall cost for the final product by reducing the raw material used and also saving capital equipment expenditure. Additionally the high throughput and modest capital expenditure of these processes means that the cost of capital is low. Finally, since the HTS is grown on layers built on low cost flexible metal tape, the raw material cost is low.

Yet other objects of the inventions are to provide for an inherently scalable process, having reduced number of process steps per layer, with high throughput. This should result in a large HTS growth area.

BRIEF DESCRIPTION OF THE DRAWINGS

FIG. 13 is a plot of the critical current density ($J_c$) as a function of the angle of the magnetic field from the c-axis FIGS. 14 A and B show X-ray diffraction scan showing 2θ-ω and ω scans for.

DETAILED DESCRIPTION OF THE INVENTION

Definitions:

"ReBaCuO superconductor" means rare earth (Re), barium (Ba), copper (Cu) and oxygen (O) containing compositions that constitute superconductors at cryogenic temperatures.

"Substantially pure ReBaCuO superconductor" means a ReBaCuO superconductor that contains less than 2%, preferably less than 1%, most preferably less than 0.5% by weight of materials other than Re, Ba, Cu and O.

Figure 1:
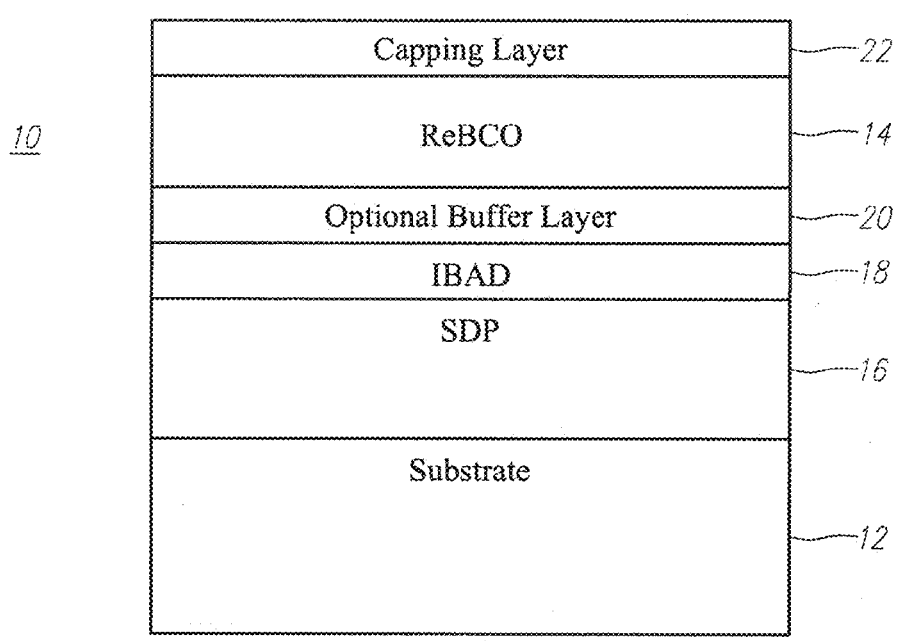
FIG. 1 is a cross-sectional view of a coated conductor.

Structure and Process:

FIG. 1 shows a cross-section of one embodiment of the coated conductor 10. At least a substrate 12 and (RE)BCO layer 14 are provided. The substrate 12 supports, either directly or through the presence of one or more intermediate layers, the (RE)BCO(RE)BCO layer 14. Optionally, a solution deposition planarization layer 16 is formed at the surface of the substrate 12. The solution deposition planarization layer 16 may then directly support the (RE)BCO layer 14, or may interface with an intermediate layer 18. In one implementation, the intermediate layer 18 may be an IBAD epitaxial layer, such as an IBAD epi MgO layer. The intermediate layer 18 may directly support the (RE)BCO layer 14, or may interface with a optional buffer layer 20, which in turn can support the (RE)BCO layer 14.

The substrate may be either non-flexible or flexible. If non-flexible, it may be a crystal substrate, such as an MgO substrate. If the substrate is flexible, it may be for example a flexible metal tape. In one implementation, substrate 10 is a flexible metal substrate that can for example be stainless steel or Hastelloy. The thickness of the substrate is often in the range of 0.002 to 0.004 inch. The substrate material must meet certain selection criteria: it must be mechanically and chemically stable at the growth temperature of the superconductor (~800 C), it must have a thermal expansion coefficient similar to the superconductor (~12-13), a high yield strength, and be non-magnetic.

Figure 2:
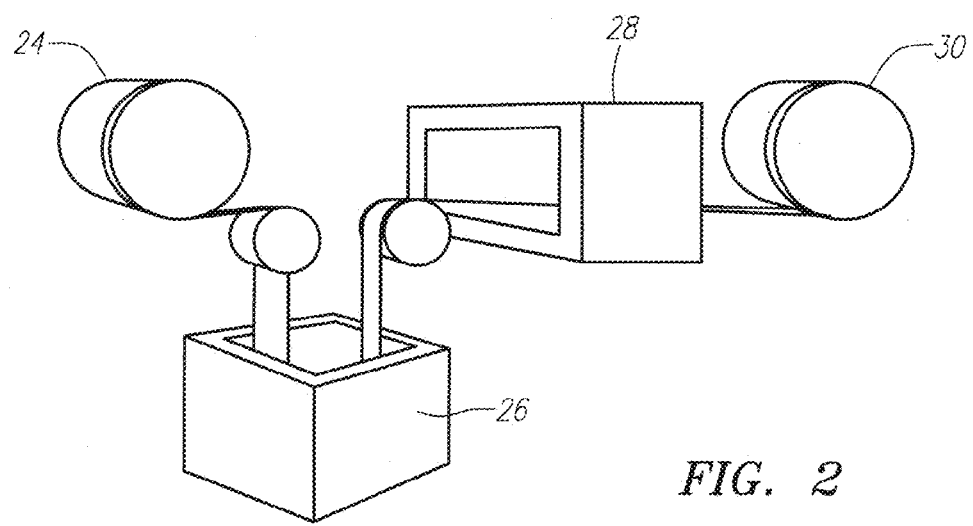
FIG. 2 is a perspective drawing of the solution deposition planarization (SDP) equipment and method.
Figure 3:
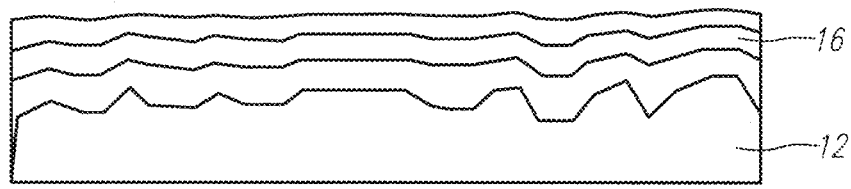
FIG. 3 is an exploded cross-sectional view of a substrate and planarization layer after the solution deposition planarization process.

With reference to FIGS. 2 and 3, an optional planarization step is performed. The planarization provides an amorphous metal oxide layer that is solution deposited preferably using a solution deposition planarization (SDP) process on the substrate. This one layer provides a diffusion barrier, planarizes the rough metal surface, is chemically stable and provides an amorphous surface suitable for the growth of subsequent layers. Often to otherwise accomplish all of these features several separate steps including electropolishing, the addition of a diffusion barrier and a amorphous bed layer for ion beam assisted deposition (IBAD), would be required. Substrate tape stock 24 may be fed from a spool into a bath 26 containing the planarization solution. The coated conductor passes through dryer 28 onto a take up spool having the now planarization layer coated substrate 30. FIG. 3 shows an exploded view of the substrate 12 and the solution deposition planarization layer 16.

The solution deposition planarization (SDP) process uses metal organic precursor dissolved in solvent. This solution can be applied to the metal substrate utilizing techniques such as dip coating, spray coating, meniscus coating or slot die coating. The solution deposited on the metal substrate travels into a heater where the solvent is evaporated out, and the organic carrier is volatilized leaving behind only the dense, amorphous, metal oxide film. Multiple coatings deposited by sequentially repeating this process creates a smooth (roughness ~1 nm), planarized, chemically stable, and amorphous surface.

Figure 4:
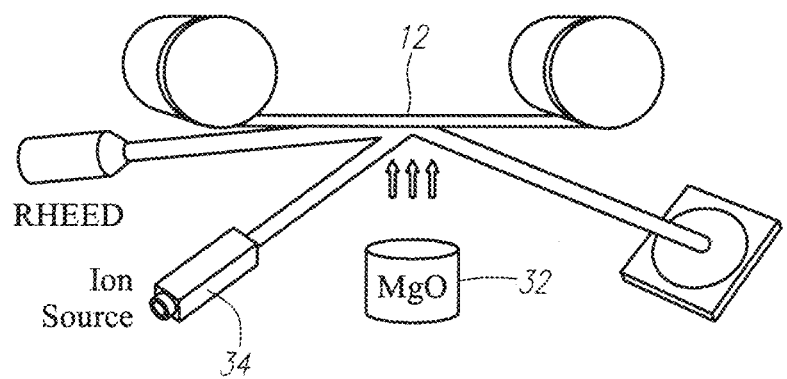
FIG. 4 is a perspective drawing of the ion beam assisted deposition equipment and method.

With reference to FIG. 4, the optional next layer is deposited using an ion beam assisted deposition (IBAD) technique. A metal oxide having a rock-salt-like crystal structure, usually MgO, is deposited with the assistance of an ion beam (see, e.g., Do et al., U.S. Pat. No. 6,190,752 entitled "Thin Films Having Rock-Salk-Like Structure Deposited on Amorphous Surfaces", see also Wang, et al., "Deposition of in-plane textured MgO on amorphous $Si_3N_4$ substrates by ion-beam-assisted deposition and comparisons with ion-beam-assisted deposited yttria-stabilized-zirconia" Appl. Phys. Lett. 71 (20), pp. 2955-2957, 17 Nov. 1997 and Iijima et al, "Research and Development of Biaxially Textured IBAD-GZO Templates for Coated Superconductors", MRS Bulletin, August 2004 pp. 564-571, all incorporated herein as if fully set forth herein) to permit the formation of a 3-dimensionally ordered, crystalline thin film. Optionally a thicker layer of the metal oxide can be grown epitaxially to increase thickness and improve crystallinity. Ion beam assisted deposition (IBAD) is typically done by vacuum evaporating magnesium oxide (MgO) (source 32) while directing an ion beam 34 at an angle to the substrate 12. When the ion beam is set to the correct energy and density, it gives bi-axially textured orientation to the MgO. This IBAD textured layer then provides a seed layer for the epitaxial growth of (RE)BCO material.

Next an optional buffer layer 20 (FIG. 1) is grown on the IBAD layer to improve the lattice match to the (RE)BCO film. The epitaxial HTS layer is next grown, preferably using a reactive co-evaporation cyclic deposition and reaction (RCE-CDR), described in more detail, below. Lastly an optional cap layer 22 of metal, preferably silver is deposited on the HTS to provide electrical contact to the superconducting film and physical protection.

Figure 5:
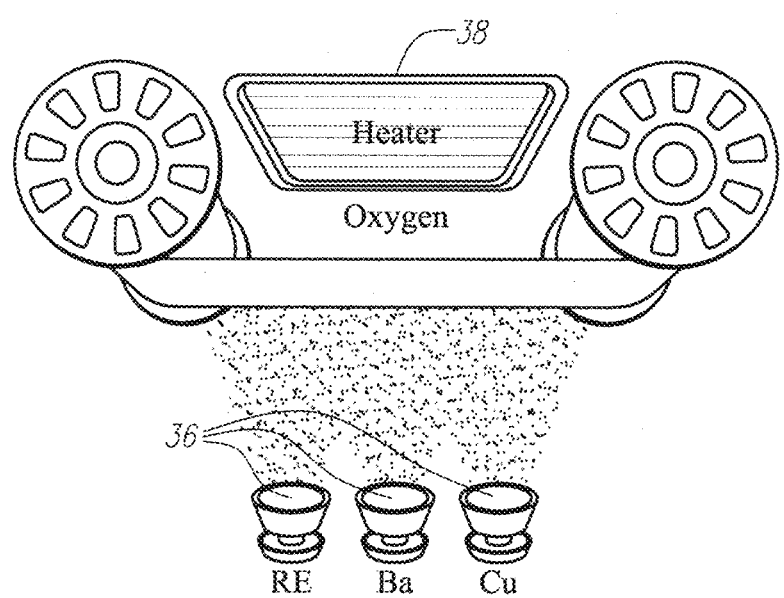
FIG. 5 is a perspective drawing of the reactive co-evaporation, cyclic deposition and reaction (RCE-CDR) equipment and method.

With reference to FIG. 5, the RCE-CDR uses high purity metal targets 36 of one or more of the following rare earths (Yttrium, Samarium, Gadolinium, Neodymium, Dysprosium, etc.), barium and copper in an oxygen background environment of $10^{-5}$ Torr. The film growth occurs when it passes through the oxygen pocket where the pressure is maintained at 10-30 mTorr. This deposition and film growth cycle is done at 5-10 Hz by rotating the sample holder. Heater 38 heats the substrate. After the film is fully grown it is cooled down in oxygen pressure of 600 Torr. Techniques for RCE-CDR are now known to those skilled in the art, see, e.g., Ruby et al, "High-Throughput Deposition System for Oxide Thin Film Growth By Reactive Coevaporation", now published as US Published Application 2007/0125303, which is incorporated herein by reference for the teaching of RCE-CDR, as if fully set forth herein.

Figure 6:
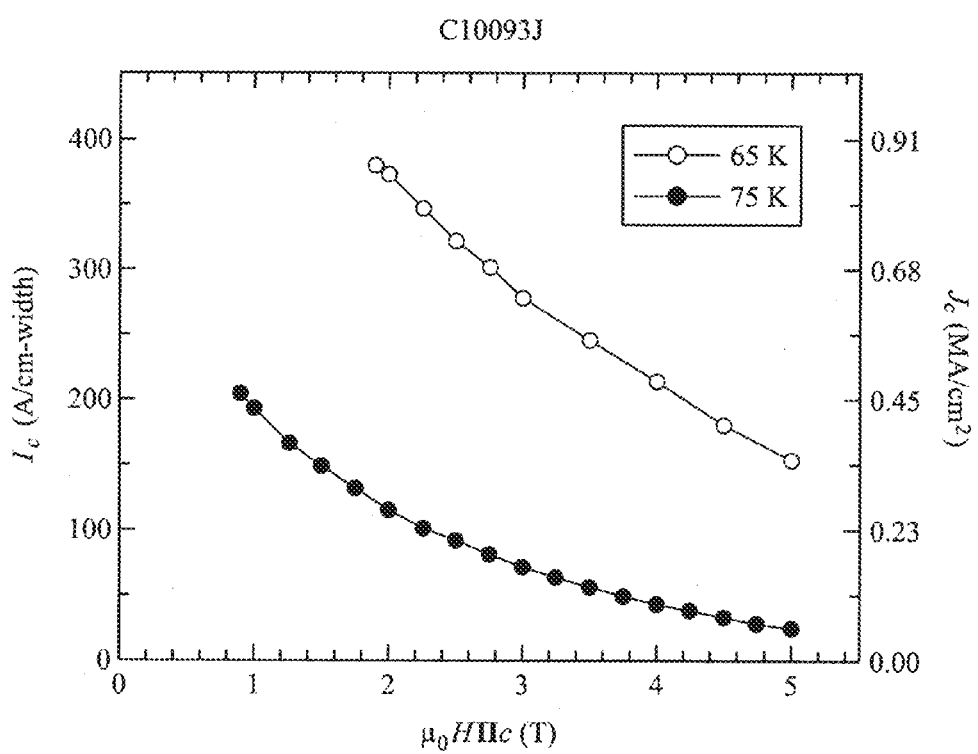
FIG. 6 is a plot of the critical current ($I_c$) (left vertical axis) and critical current density ($J_c$) (right vertical axis) as a function of magnetic field strength applied parallel to the sample, for two different temperatures.

FIG. 6 is a plot of the critical current ($I_c$) (left vertical axis) and critical current density ($J_c$) (right vertical axis) as a function of magnetic field strength applied parallel to the sample, for two different temperatures. The graph shows the critical current of (RE)BCO grown on flexible metal tape measured in magnetic field at different temperatures. As the magnetic field increases the critical current decreases. At a field of 3 T, with the magnetic field parallel to the film, the $I_c$ is approximately 290 A/cm-width, and $J_c$ is approximately 0.66 MA/cm$^2$. The upper data set is at 65 K and the lower data set is at 75 K.

Figure 7:
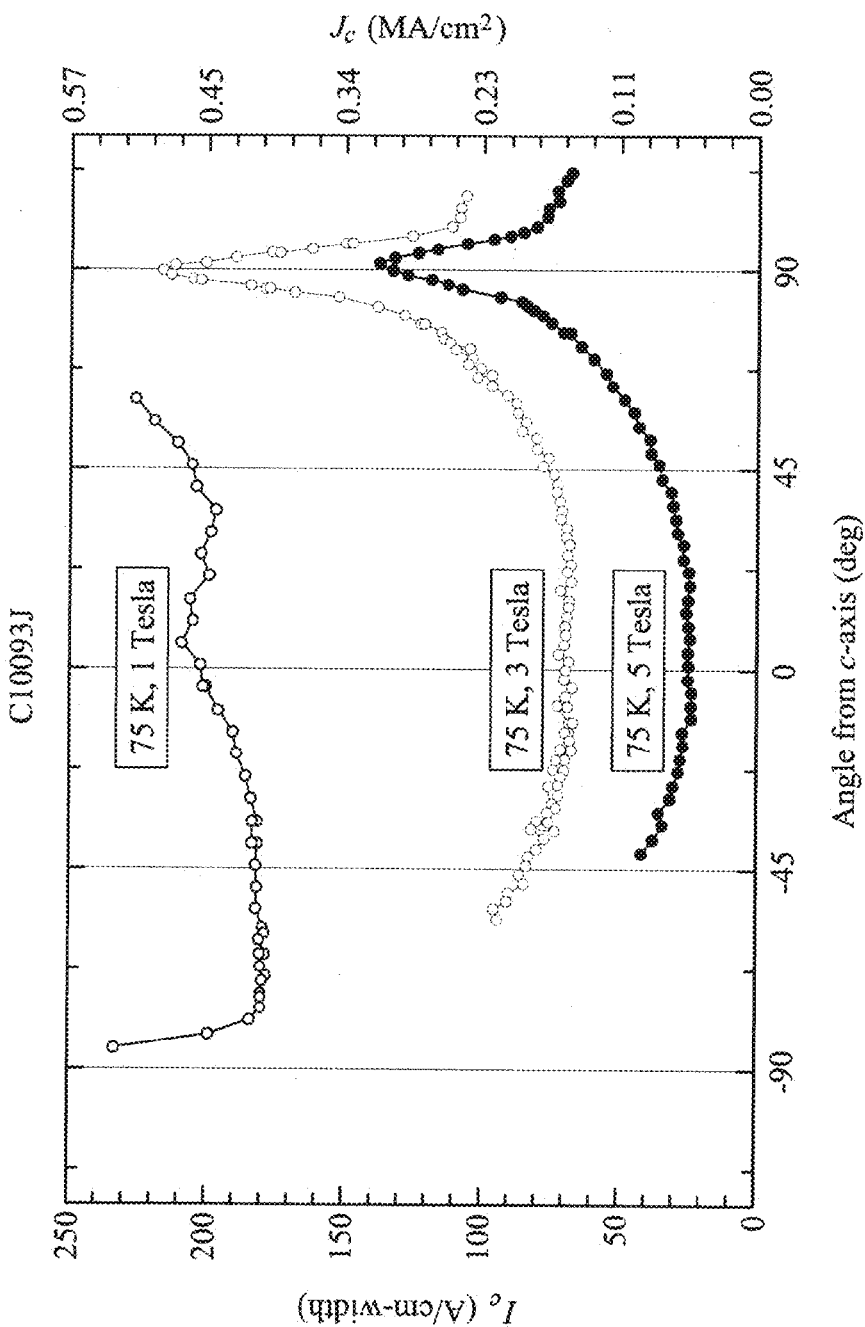
FIG. 7 is a plot of the critical current ($I_c$) (left vertical axis) and critical current density ($J_c$) (right vertical axis) as a function of the angle from the c-axis applied to the sample.

FIG. 7 is a plot of the critical current ($I_c$) (left vertical axis) and critical current density ($J_c$) (right vertical axis) as a function of the angle from the c-axis applied to the sample. FIG. 7 shows the critical current of the same sample as in FIG. 6 measured at 75 K as a function of the angle of the applied magnetic filed. It shows a very strong peak when the magnetic filed is perpendicular to the film normal. The upper data set is at 75 K in a 3 T field, and the lower data set is at 75 K in a 5 T field.

Figure 8:
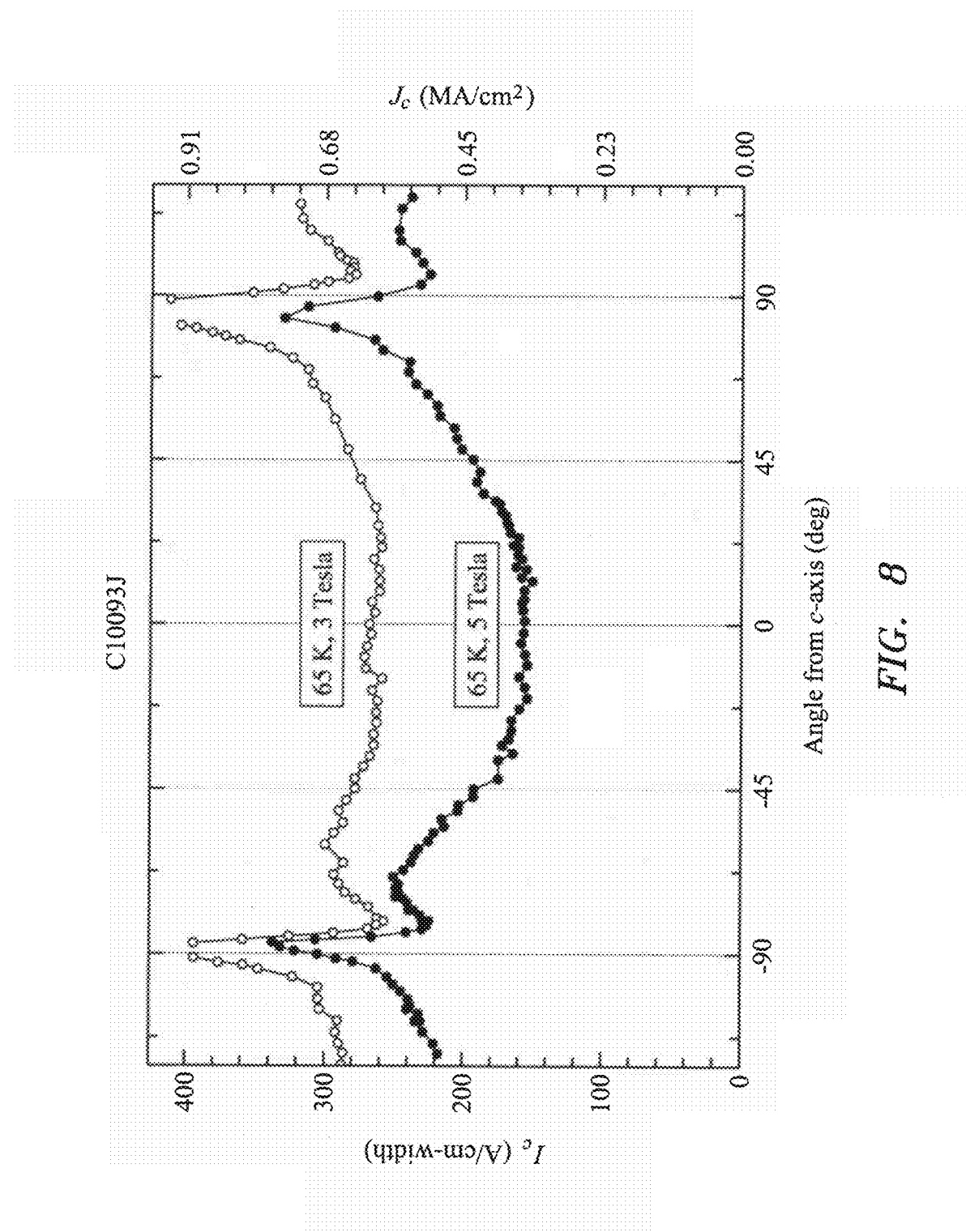
FIG. 8 is a plot of the critical current ($I_c$) (left vertical axis) and critical current density ($J_c$) (right vertical axis) as a function of the angle of the magnetic field from the c-axis.

FIG. 8 is a plot of the critical current ($I_c$) (left vertical axis) and critical current density ($J_c$) (right vertical axis) as a function of magnetic field strength applied parallel to the sample. FIG. 8 is the same type of measurement as FIG. 7 but done at a lower temperature of 65 K. The critical current increases significantly when cooled from 75 K. At 65 K and 3 T the minimum critical current is 250 A. The upper data set is at 65 K in a 3 T field, and the lower data set is at 55 K in a 5 T field.

Figure 9:
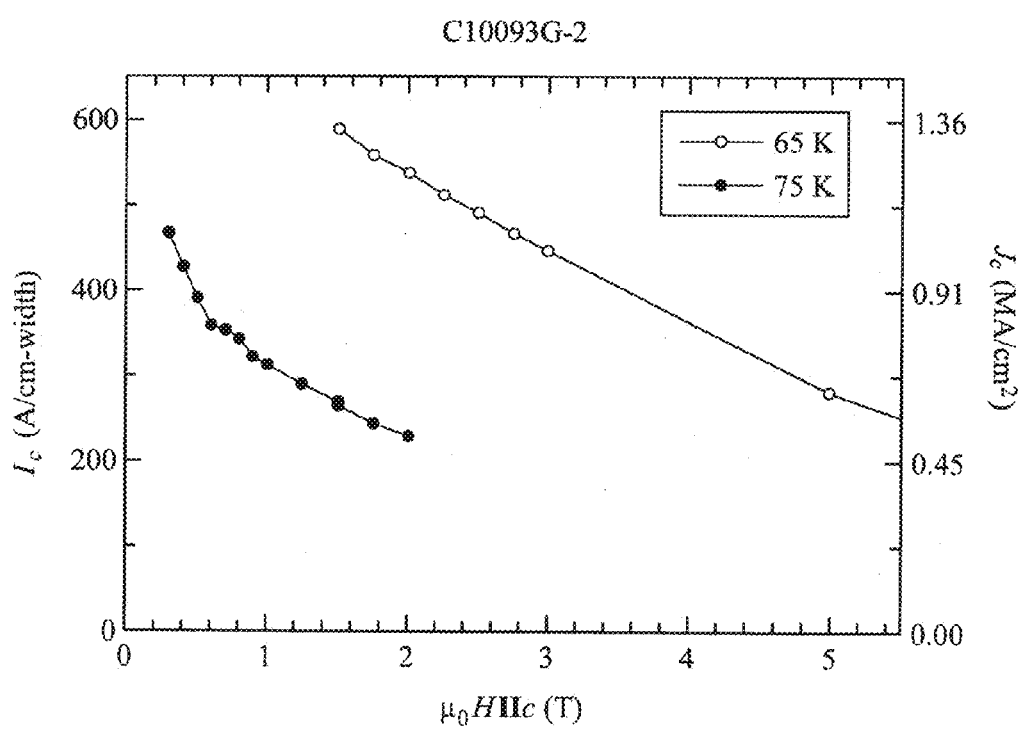
FIG. 9 is a plot of the critical current ($I_c$) (left vertical axis) and critical current density ($J_c$) (right vertical axis) as a function of magnetic field strength applied parallel to the sample, at two different temperatures.

FIG. 9 is a plot of the critical current ($I_c$) (left vertical axis) and critical current density ($J_c$) (right vertical axis) as a function of magnetic field strength applied parallel to the sample, at two different temperatures. It shows the critical current of the same (RE)BCO deposited on single crystal MgO instead of the metal tape. This was measured in magnetic field at different temperatures under the same condition as FIG. 6. The minimum critical current improves roughly 50% when (RE)BCO is grown on single crystal. The upper data set is at 65 K and the lower data set is at 75 K.

Figure 10:
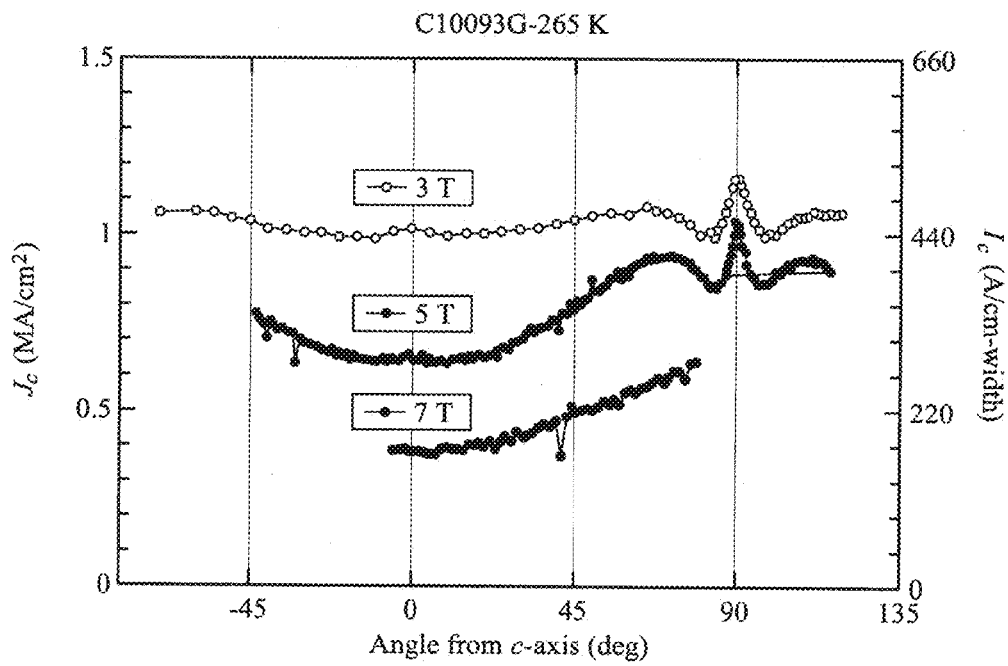
FIG. 10 is a plot of the critical current density ($J_c$) (left vertical axis) and critical current ($I_c$) (right vertical axis) as a function the angle of the magnetic field from the c-axis.

FIG. 10 is a plot of the critical current density ($J_c$) (left vertical axis) and critical current ($I_c$) (right vertical axis) as a function of magnetic field strength applied parallel to the sample. FIG. 10 shows the critical current of the sample grown on single crystal MgO measured at 65 K as a function of the angle of the applied magnetic field. Comparing FIG. 8 to FIG. 10 shows a minimum critical current improvement of 80%. The uppermost data set is at 3 T, the middle data set is at 5 T and the bottom data set is at 7 T.

Figure 11:
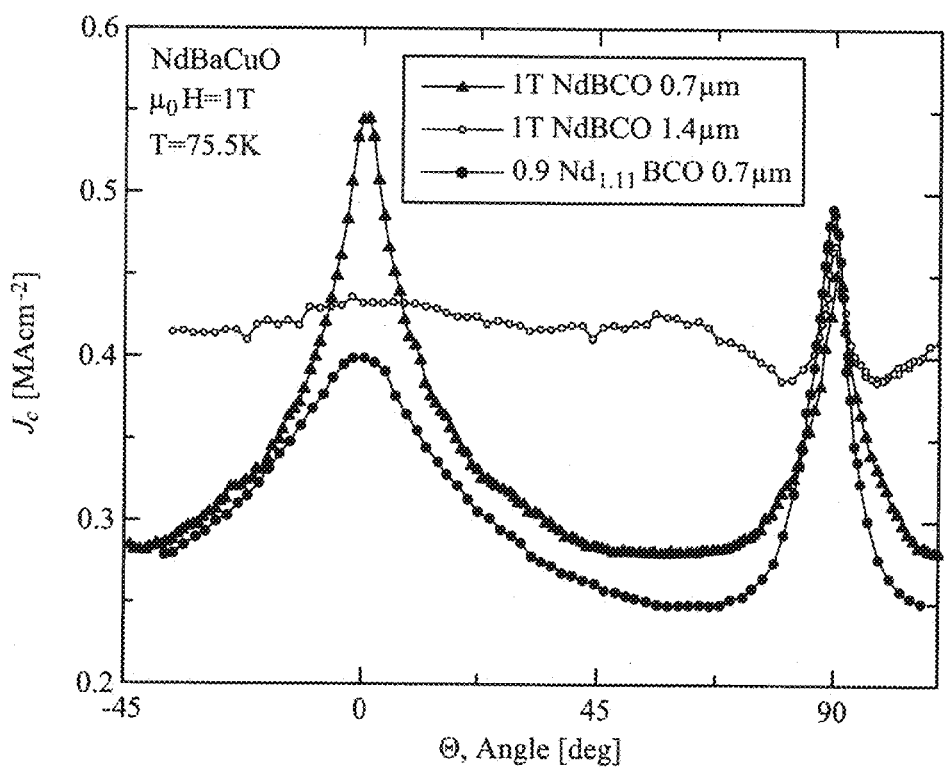
FIG. 11 is a plot of the critical current density ($J_c$) as a function of the angle of the magnetic field from the c-axis for three differently prepared samples of NdBCO

FIG. 11 is a plot of the critical current density ($J_c$) as a function of the angle from the c-axis of the magnetic field applied to a three different NdBCO samples. The field is 1 T, at 75.5 K. At angle 0, the uppermost data set is for a field of 1 T, with NdBCO of thickness 0.7 µm, the middle data set is for a field of 0.9 T, for Nd$_{1.1}$BCO of thickness 0.7 and the bottom data set is for a field of 1 T for NdBCO of thickness 1.4 µm. The off-stoichiometry for Nd rich films significantly enhanced the minimum $J_c$ values, by approximately a factor of 4.

Figure 12:
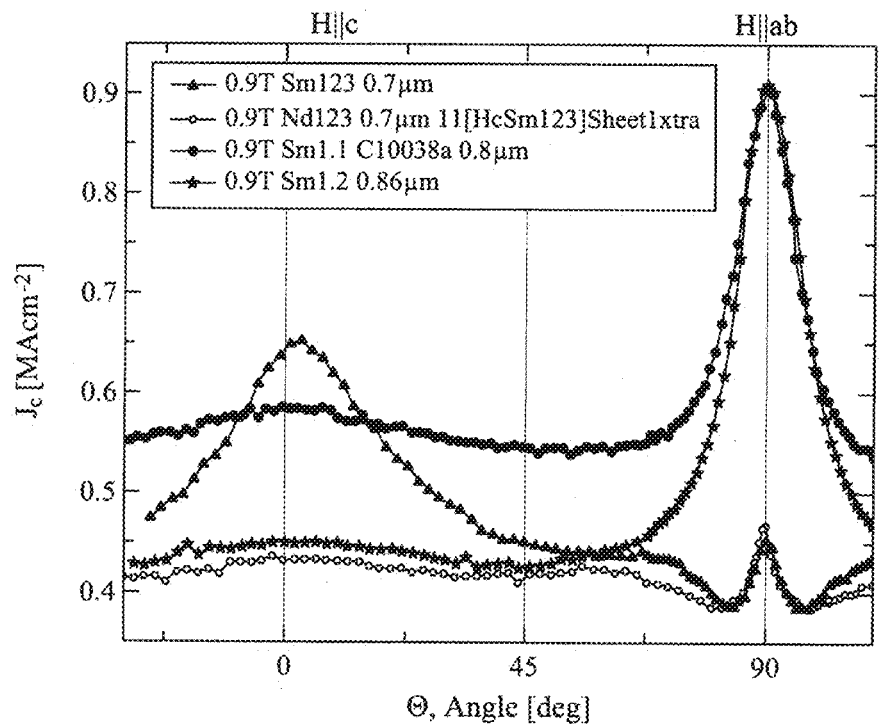
FIG. 12 is a plot of the critical current density ($J_c$) as a function of the angle of the magnetic field from the c-axis for three differently prepared samples of SmBCO and one sample of NdBCO.

FIG. 12 is a plot of the critical current density ($J_c$) as a function of the angle from the c-axis of the magnetic field applied to a three different SmBCO samples and one NdBCO sample. FIG. 12 may be compared to FIG. 11 for the difference between the two rare earths (Nd and Sm). At angle 0, the uppermost data set is for a field of 0.9 T, with SmBCO of thickness 0.7 µm, the second data set is for a field of 0.9 T, for Sm$_{1.1}$BCO of thickness 0.8 µm, the third data set is for a field of 0.9 T, for Sm$_{1.2}$BCO of thickness 0.86 µm, and the bottom data set is for a field of 0.9 T for NdBCO of thickness 0.7 µm. The off-stoichiometry for Sm rich films significantly enhanced the minimum $J_c$ values, especially those having a Sm enhancement of substantially 1.1, or 10%.

Figure 13:
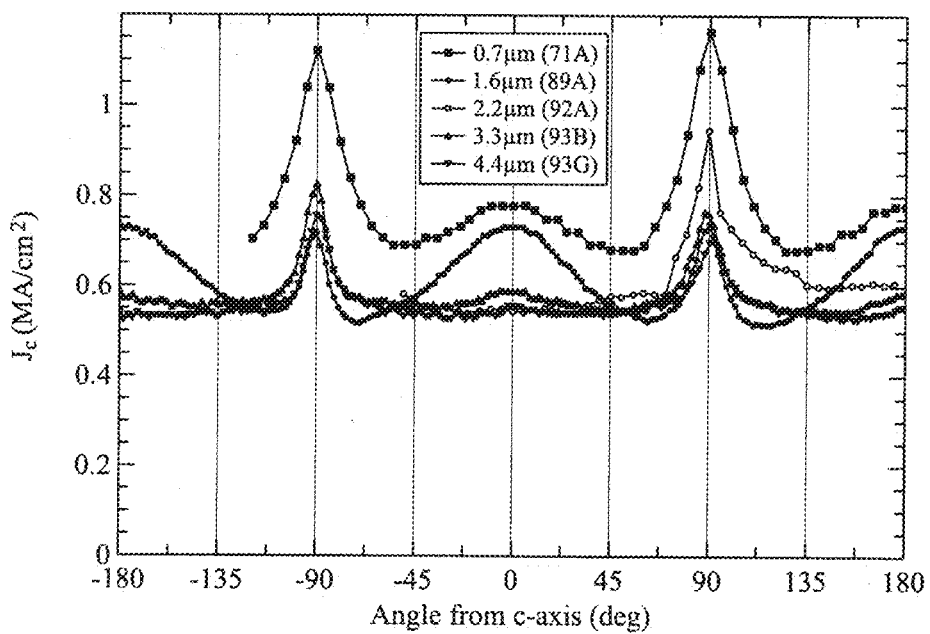

FIG. 13 is a plot of the critical current density ($J_c$) as a function of the angle from the c-axis of the magnetic field applied to a series of SmBCO samples having various thicknesses. At angle 0 the upper most data are for the 0.7 µm film, the 1.6 µm film, then the 4.4 µm film, then the 3.3 µm film, with the 2.2 µm film showing at angle 0 as the lowest datapoint. For films less than 1.6 µm, and particularly for films at substantially 2.2 µm and thicker, the angular dependence of the $J_c$ is essentially flat.

Figures 14A, 14B:
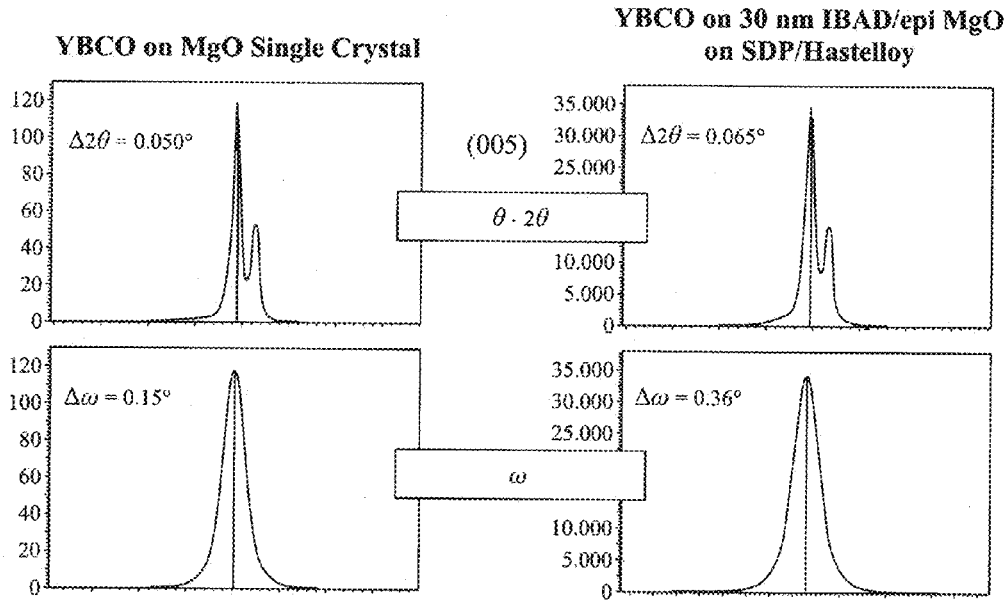
FIG. 14A YBCO on MgO single crystal and FIG. 14B YBCO on IBAD/epi MgO on SDP Hastelloy.

FIGS. 14 A and B show X-ray diffraction patterns showing 2θ-ω and ω scans for: FIG. 14A YBCO on MgO single crystal and FIG. 14B YBCO on IBAD/epi MgO on SDP Hastelloy. The Δ2θ is preferably less than 0.2, more preferably less than 0.1, and most preferably less than 0.050. The Δω is preferably less than 0.5, more preferably less than 0.36, and most preferably less than 0.15. These results establish that the films are of very high crystal quality.

Figure 15:
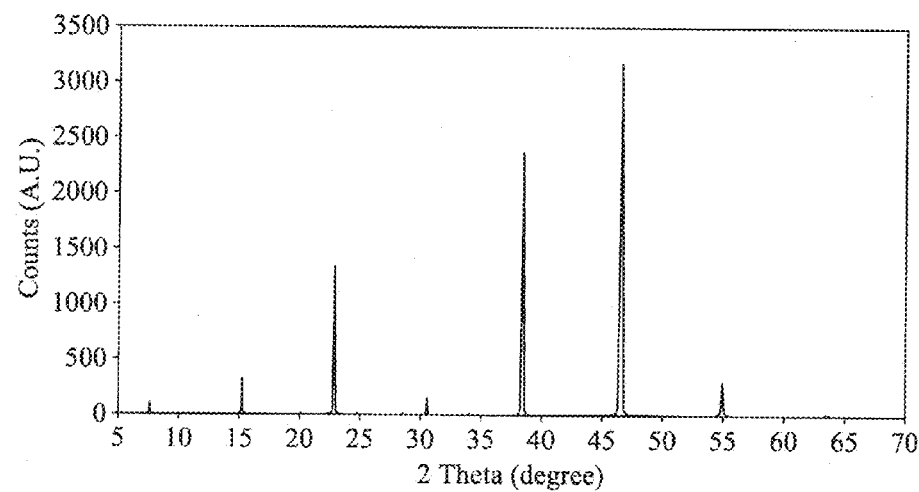
FIG. 15 is a X-ray diffraction 2θ-ω scan showing SmBCO on IBAD MgO and SDP on Hastelloy.

FIG. 15 shows the X-ray diffraction pattern of (RE)BCO grown on metal tape substrate. (001) peaks are well defined and it is a clear indication that the HTS is growing c-axis orientated. There are no signs of polycrystalline material nor evidence of a, b oriented growth.

Figure 16:
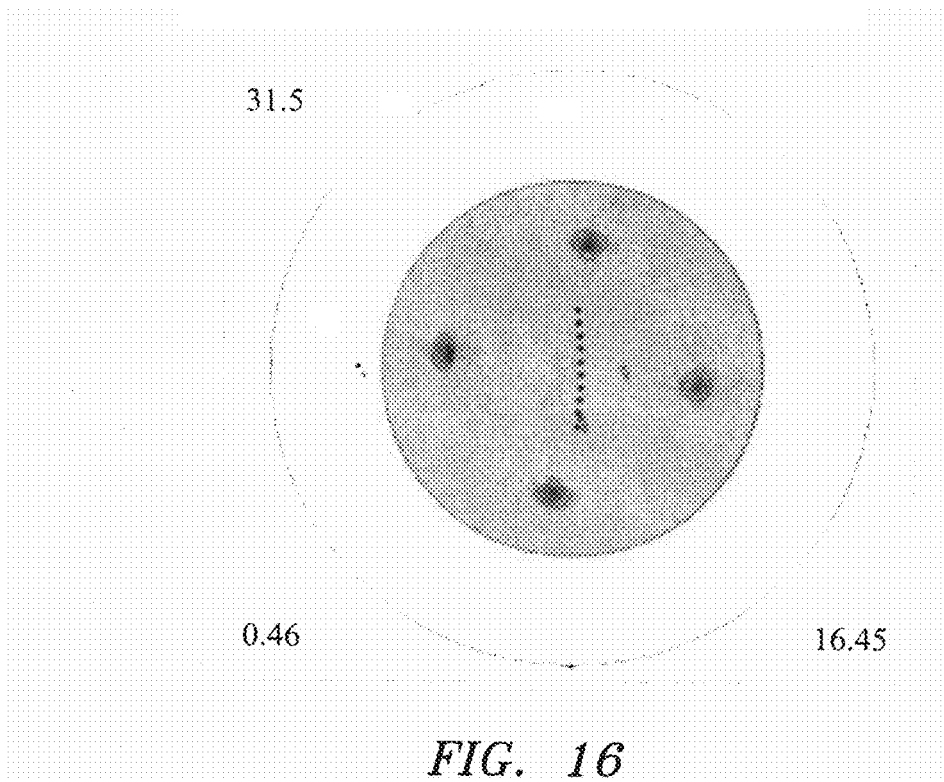
FIG. 16 is a X-ray diffraction pole figure of (RE)BCO (103) peak.

FIG. 16 is a X-ray diffraction pole of (RE)BCO (103) peak which shows that in-plane texture is well defined having four strong peaks.

Figure 17:
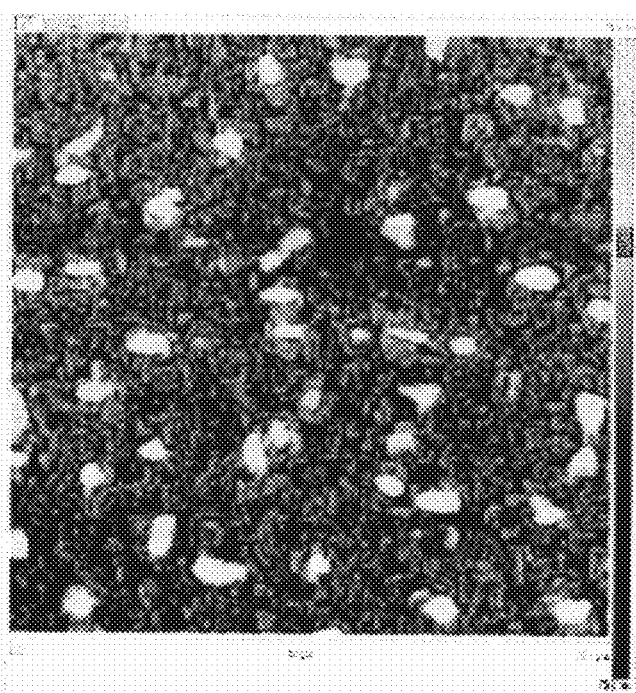
FIG. 17 is an atomic force microscope (AFM) image of (RE)BCO grown on a metal substrate, and then capped with silver.

FIG. 17 is an Atomic Force Microscopy (AFM) image showing the surface image of a thin layer of silver deposited on (RE)BCO grown on metal substrate. The large particles are copper oxide covered by silver and the short needle-like microstructure comes from the silver grains grown on top of (RE)BCO.

Figure 18:
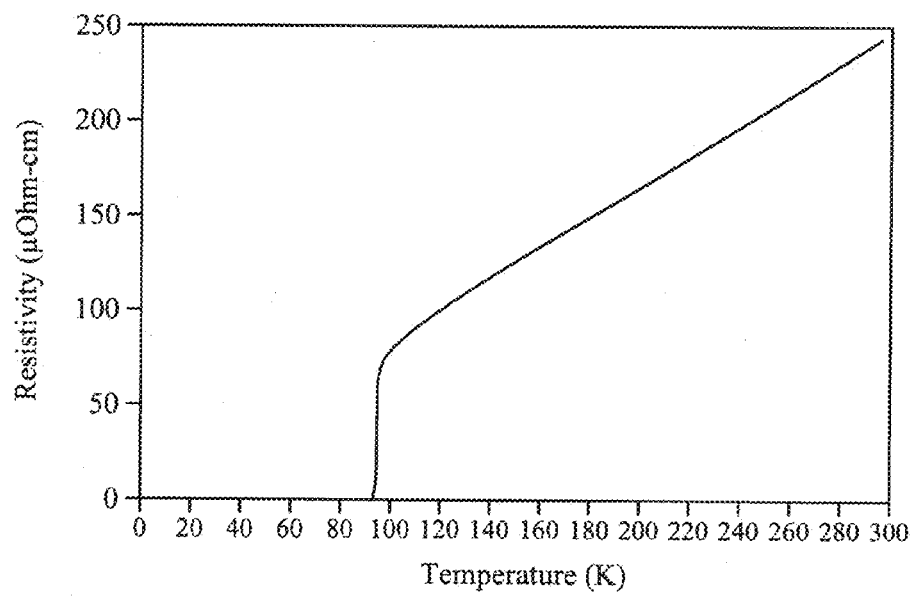
FIG. 18 is a graph of resistivity as a function of temperature of a sample of SmBCO grown on single crystal MgO.

FIG. 18 is a resistivity vs. temperature curve of (RE)BCO grown on MgO single crystal substrate. The single crystal was inserted next to the metal substrate as a process monitor. This particular sample had a critical temperature of 93.7 Kelvin.

Figure 19A:
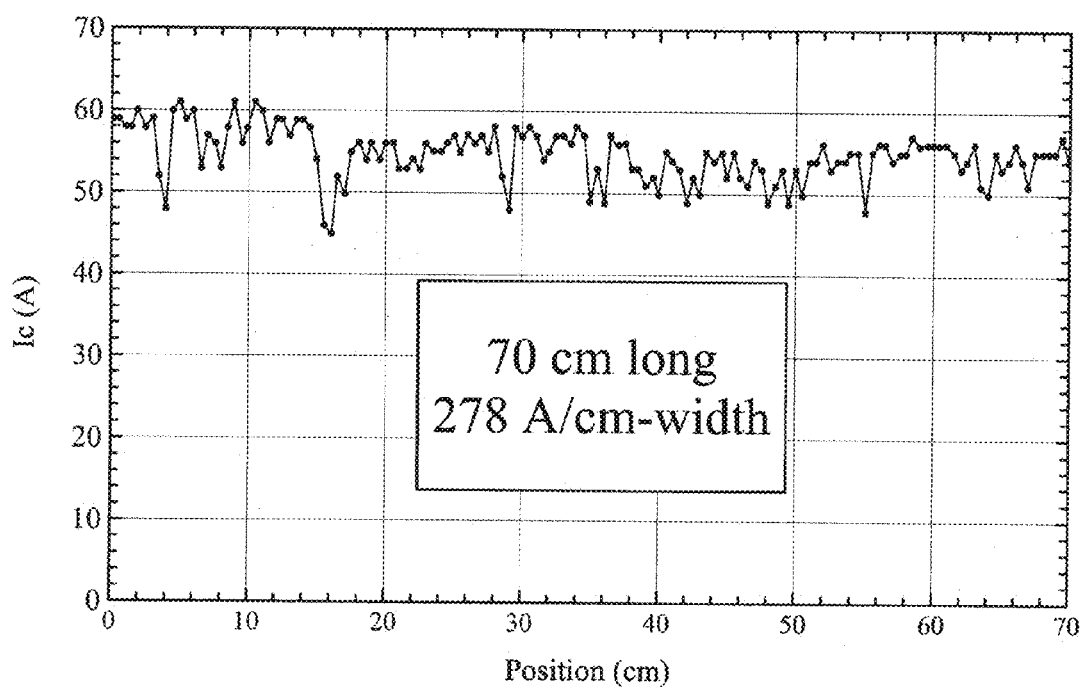
FIGS. 19A, B and C are graphs of critical current ($I_c$) under magnetic field of 0.66 T as a function of position along a tape for a 70 cm long tape (FIG. 19A), a 120 cm long tape (FIG. 19B) and a 24 cm long tape (FIG. 19C), for self-field at 77 K.
Figure 19B:
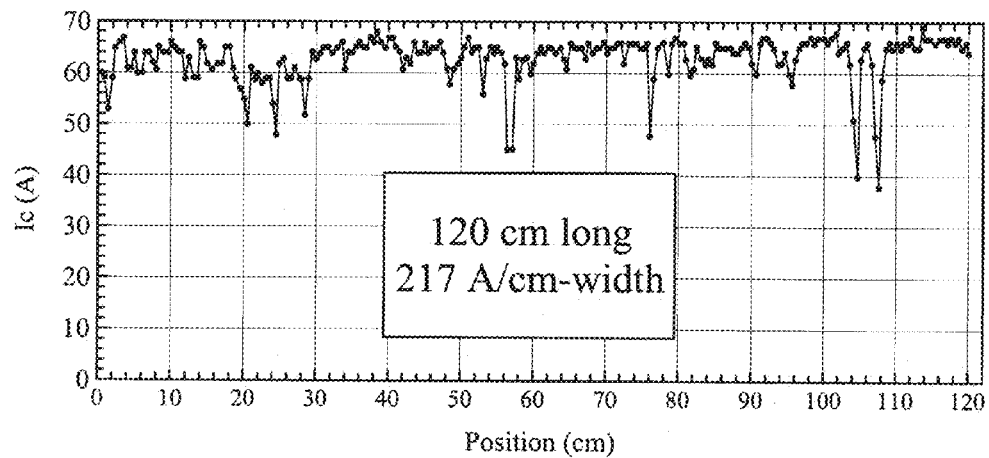
Figure 19C:
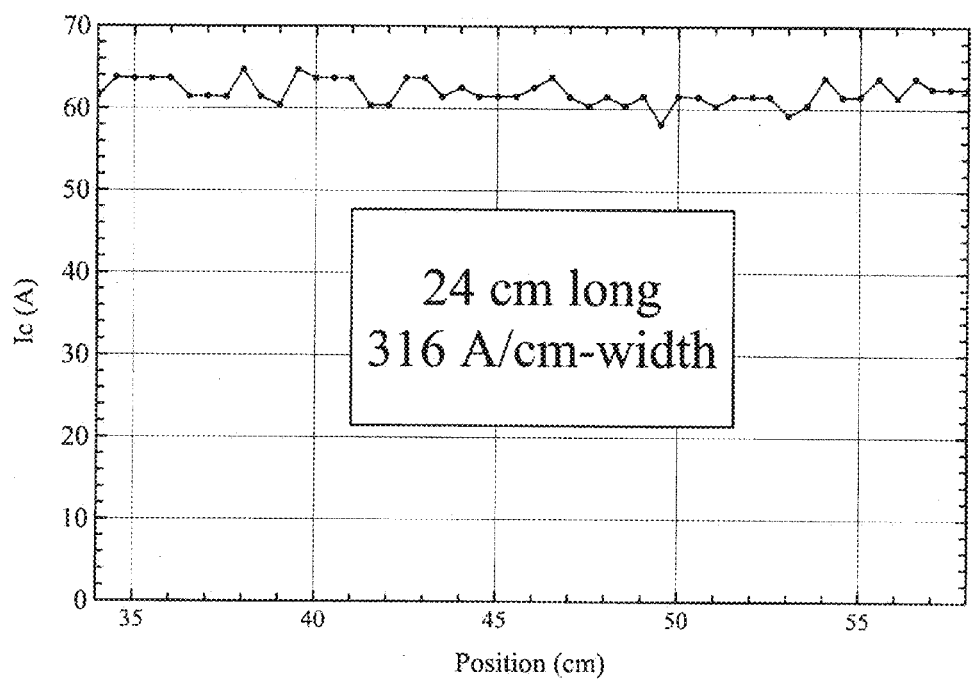

FIGS. 19 A, B and C are graphs of critical current ($I_c$) under magnetic field of 0.66 T as a function of position along a tape for a 70 cm long tape (FIG. 19A), a 120 cm long tape (FIG. 19B) and a 24 cm long tape (FIG. 19C), for self-field at 77 K.

Experimental

High temperature superconductor (RE)BCO is deposited on 2 different types of substrates: flexible metal substrate and single crystal magnesium oxide. The dimension of the metal tape is 4 cm long, 1 cm wide and 0.004 inch thick. Solution deposition layer of metal oxide is deposited on the metal substrate followed by ion beam assisted deposition of magnesium oxide. Single crystal magnesium oxide substrate is cut into 1 cm length, 1 cm width and 0.02 inch thick piece and crystal orientation is (100).

The method of deposition is reactive co-evaporation. High purity metal targets of rare earths (yttrium, samarium, gadolinium, neodymium, dysprosium, etc.), barium and copper are used for evaporation. Barium and copper can be evaporated with a thermal source, whereas most of the rare earths require electron beam source because of their high melting temperature. Samarium is an exception due to its nature to sublimate. It is easily deposited with special thermal source with baffles. The evaporation rate is monitored and controlled by quartz crystal monitors (QCM). Each elemental source has its own QCM directed line-of-sight through multiple collimators. The oxygen is directly supplied through the heater and its flow is controlled by a mass flow controller. The overall background oxygen pressure is monitored by a hot cathode ion gauge. Typical background pressure during deposition is in the range of 10$^{-5}$ Torr. This deposition and film growth cycle is done at 5/10 Hz by rotating the sample holder attached to the heater. The film growth occurs when the sample passes through the oxygen pocket where the pressure is maintained at 10/30 mTorr. Heater temperature ranges between 750-800° C. After the film is fully grown it is cooled down in oxygen pressure of 600 Torr.

These inventions provide cutting edge high-magnetic-field test results for second generation (2G) HTS wire. This demonstrates exceptional in-field critical current values. This world-class current-carrying capability in high magnetic field demonstrates the effectiveness of the disclosed HTS fabrication process at producing 2G HTS wire for demanding applications such as superconducting fault current limiters and high-power wind turbine generators.

The 2G HTS coated conductor sample on a template that exhibits a minimum critical current of 228 amperes (A) at a temperature of 65 Kelvin (K) in an applied magnetic field of 3 Tesla (T), corresponding to 256 A/centimeter (cm)-width. This critical current is the minimum value as a function of magnetic field angle. The maximum critical current of this sample at 65 K exceeded 404 A/cm-width for a 3-T magnetic field oriented parallel to the coated conductor surface; this latter current value was limited by the amount of current supplied by the measurement apparatus. In a ST field at 65 K, the coated conductor exhibited a minimum critical current of 143 A/cm-width and a maximum critical current of 322 A/cm-width.

This sample was fabricated using a straightforward HTS structure and did not need to add additional elements or so-called artificial pinning centers to the coated conductor to obtain this result.

These 2G HTS wires utilize HTS material deposition processes and volume manufacturing to produce energy-efficient, cost-effective, and high-performance 2G HTS wire for next generation power applications. 2G HTS wire is fabricated using its deposition technology known as reactive coevaporation with cyclic deposition and reaction (RCE-CDR). This specific sample of 2G HTS wire is 8.9 millimeters wide×4.4 microns thick and was grown on a 1-cm-wide×4-cm-long template. This simplified template contained a reduced number of layers compared to competing 2G HTS wire technologies. The template consisted of a non-magnetic nickel-alloy substrate followed by layers of only two materials: a solution-deposition planarization (SDP) layer and an ion-beam assisted deposition (IBAD) layer. An advantage of the RCE-CDR technology is that it allows high-performance 2G HTS wire to be grown on these simplified templates. This simplified template platform combined with the RCE-CDR process results in a superior high-yield, low-cost 2G HTS wire technology.

Applications

Coated conductors are useful in a wide variety of applications including but not limited to high power transmission cables (AC), superconducting fault current limiters, wind turbine (generator), industrial motors and generators, and magnetic resonance imaging machines.

All publications and patents cited in this specification are herein incorporated by reference as if each individual publication or patent application were specifically and individually indicated to be incorporated by reference. Although the foregoing invention has been described in some detail by way of illustration and example for purposes of clarity and understanding, it may be readily apparent to those of ordinary skill in the at in light of the teachings of this invention that certain changes and modifications may be made thereto without departing from the spirit or scope of the following claims.

We claim:

1. A coated conductor comprising:
a substrate and
a (RE)BCO superconductor supported by the substrate, the superconductor adapted to carry current in a superconducting state,
the superconductor having a current (I) carrying capacity of at least 250 A/cm width in a Field of 3 T, at 65K, at all angles relative to the coated conductor.

2. The coated conductor of claim 1 wherein the current is in the range of 250 to 500 A/cm.

3. The coated conductor of claim wherein the current is the critical current ($I_c$) of the coated conductor.

4. The coated conductor of claim wherein the substrate is non-flexible.

5. The coated conductor of claim 4 wherein the non-flexible substrate is a crystal substrate.

6. The coated conductor of claim 5 wherein the crystal substrate is an MgO substrate.

7. The coated conductor of claim 1 wherein the substrate is flexible.

8. The coated conductor of claim 7 wherein the flexible substrate is a flexible metal tape.

9. The coated conductor of claim 8 wherein the flexible metal tape is Hastelloy.

10. The coated conductor of claim 8 wherein the flexible metal tape is stainless steel.

11. The coated conductor of claim 1 wherein the substrate is a non-magnetic alloy.

12. The coated conductor of claim 11 wherein the non-metallic alloy is a non-magnetic nickel-alloy.

13. The coated conductor of claim 1 wherein a planarization layer is disposed between the substrate and the (RE)BCO.

14. The coated conductor of claim 13 wherein the planarization layer is a solution deposition planarization layer.

15. The coated conductor of claim 14 wherein the solution deposition planarization layer is a $Y_2O_3$ solution deposition planarization layer.

16. The coated conductor of claim 1 further including an intermediate layer between the substrate and the (RE)BCO.

17. The coated conductor of claim 16 wherein the intermediate layer is an ion beam assisted deposition (IBAD) epitaxial layer.

18. The coated conductor of claim 17 wherein the IBAD epitaxial layer is an MgO IBAD epi layer.

19. The coated conductor of claim 13 further including at least one intermediate layer disposed between the planarization layer and the (RE)BCO.

20. The coated conductor of claim 19 wherein the intermediate layer is an ion beam assisted deposition (IBAD) epitaxial layer.

21. The coated conductor of claim 20 wherein the IBAD epitaxial layer is an MgO IBAD epi layer.

22. The coated conductor of claim 1 wherein the (RE)BCO layer is on-1-2-3 stoichiometry.

23. The coated conductor of claim 1 wherein the (RE)BCO layer is off 1-2-3 stoichiometry.

24. The coated conductor of claim 23 wherein the (RE)BCO is $Sm_{1.1}BCO$.

25. The coated conductor of claim 1 wherein the (RE)BCO layer is substantially pure (RE)BCO.

26. The coated conductor of claim 1 containing only intrinsic pinning centers.

27. The coated conductor of claim 1 wherein the (RE)BCO is formed by RCE-CDR.

28. The coated conductor of claim 27 wherein the RCE-CDR uses a rotating circular platen.

29. The coated conductor of claim 27 wherein the RCE-CDR uses a rotating drum.

30. The coated conductor of claim 1 further including a metal layer disposed on the (RE)BCO.

31. The coated conductor of claim 30 wherein the metal layer is silver.

32. A coated conductor comprising:
a substrate and
a (RE)BCO superconductor supported by the substrate, the superconductor adapted to carry current in a superconducting state,
the superconductor having, a critical current density ($J_c$) carrying capacity of at least 0.5 MA/cm$^2$, in a Field of 3 T, at 65K, at all angles relative to the coated conductor.

33. The coated conductor of claim 32 wherein the critical current density is in the range of 0.5 to 0.85 MA/cm$^2$.

34. A multi-layer coated conductor comprising:
a substrate having a first face, the substrate having a length dimension of at least one meter,
an epitaxial layer supported by the substrate, and
a (RE)BCO superconductor layer supported by the epitaxial layer, the layer having a thickness of at least 2 microns and a length of at least one meter, the superconductor adapted to carry current in a superconducting state, having an critical current ($I_c$) of at least 100 A/cm width at a temperature of 65 K in a field of 3 Tesla at all angles relative to the coated conductor.

35. The multi-layer coated conductor of claim 34 wherein the (RE)BCO is substantially pure (RE)BCO.

* * * * *